United States Patent
Speckbacher

Patent Number: 5,852,322
Date of Patent: Dec. 22, 1998

[54] RADIATION-SENSITIVE DETECTOR ELEMENT AND METHOD FOR PRODUCING IT

[75] Inventor: Peter Speckbacher, Traunreut, Germany

[73] Assignee: Dr. Johannes Heidenhain GmbH, Traunreut, Germany

[21] Appl. No.: 776,288
[22] PCT Filed: May 9, 1996
[86] PCT No.: PCT/EP96/01976
§ 371 Date: Jul. 25, 1997
§ 102(e) Date: Jul. 25, 1997
[87] PCT Pub. No.: WO96/36999
PCT Pub. Date: Nov. 21, 1996

[30] Foreign Application Priority Data

May 19, 1995 [DE] Germany ............ 195 18 423.8

[51] Int. Cl.$^6$ ............................................. H01L 31/00
[52] U.S. Cl. .................... 257/459; 257/460; 257/464; 257/466
[58] Field of Search .................... 257/433, 461, 257/463, 464, 466, 459, 460

[56] References Cited

U.S. PATENT DOCUMENTS

| | | | |
|---|---|---|---|
| 3,802,924 | 4/1974 | Pschunder | 136/206 |
| 3,870,887 | 3/1975 | Deuker et al. | 250/370 |
| 3,959,037 | 5/1976 | Gutierrez | 148/171 |
| 3,972,750 | 8/1976 | Gutierrez et al. | 148/171 |
| 4,838,952 | 6/1989 | Dill et al. | 136/256 |
| 4,857,980 | 8/1989 | Hoeberechts | 357/30 |
| 4,897,123 | 1/1990 | Mitsui | 136/256 |
| 5,100,480 | 3/1992 | Hayafuji | 136/249 |
| 5,397,400 | 3/1995 | Matsuno et al. | 136/256 |

FOREIGN PATENT DOCUMENTS

| | | |
|---|---|---|
| 0444370 | 9/1991 | European Pat. Off. |
| 0452588 | 10/1991 | European Pat. Off. |
| 0601561 | 6/1994 | European Pat. Off. |
| 2 115 305 | 10/1972 | Germany. |
| 4102286 | 8/1992 | Germany. |

OTHER PUBLICATIONS

Patent Abstracts of Japan vol. 7, No. 204, Sep. 9, 1983, p. 61.

*Primary Examiner*—William Mintel
*Attorney, Agent, or Firm*—Brinks Hofer Gilson & Lione

[57] ABSTRACT

A radiation-sensitive detector element has an active area which is formed between two adjoining layer areas of a layer arrangement and within which a conversion of incident electromagnetic radiation into electrical signals takes place. Taking into consideration the penetration depth of the radiation, the position of the active area in relation to the two limiting surfaces is selected in such a way that at least two layer areas for connecting the detector element to an evaluation circuit can be mounted on a surface located opposite the radiation-sensitive surface which is impinged by the incident radiation.

21 Claims, 5 Drawing Sheets

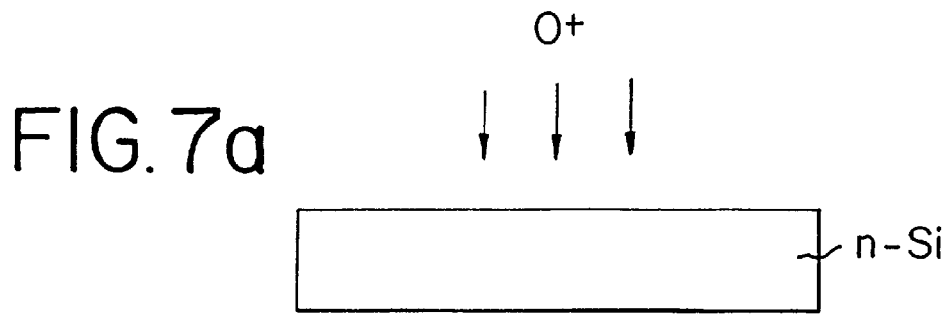
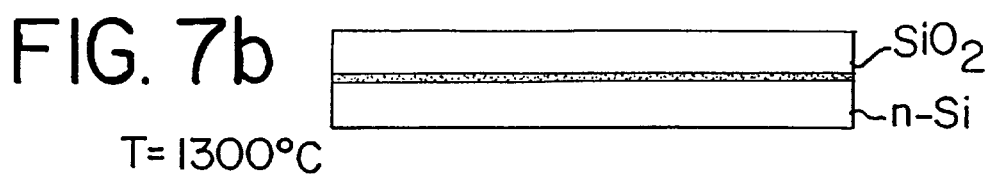
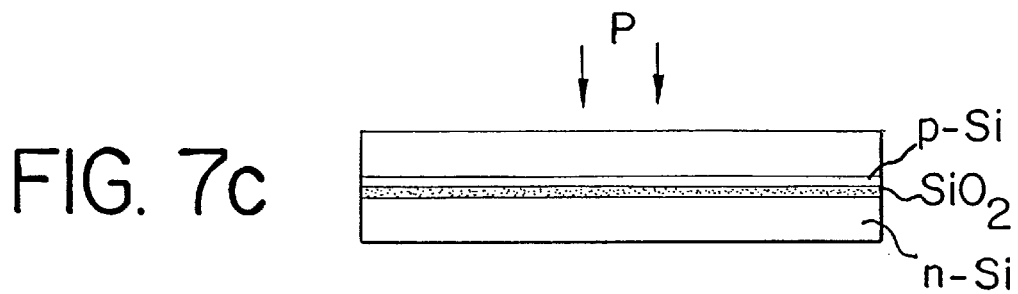
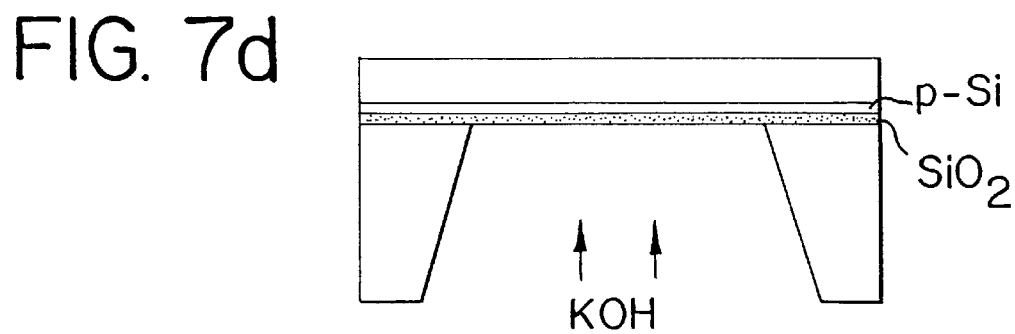
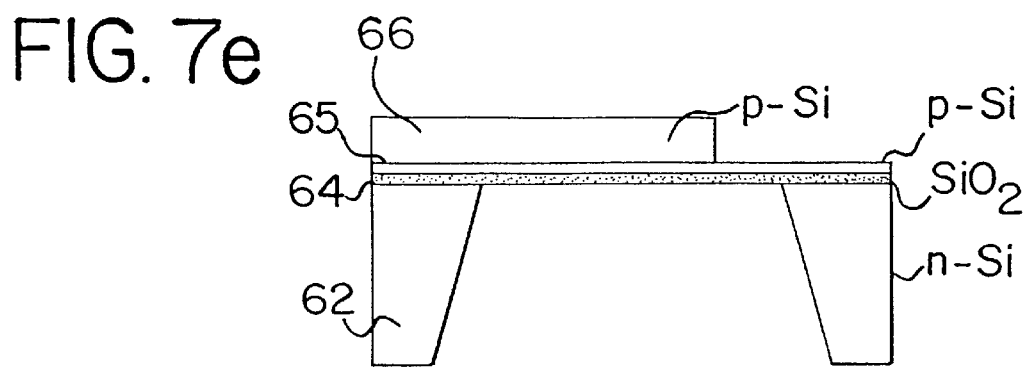

RADIATION-SENSITIVE DETECTOR ELEMENT AND METHOD FOR PRODUCING IT

FIELD OF THE INVENTION

The invention relates to a radiation-sensitive detector element with an active area formed between two adjoining layer areas of a layer arrangement of different charge carriers, in which a conversion of incident electromagnetic radiation takes place. The invention further relates to a process for producing a radiation-sensitive detector element.

BACKGROUND OF THE INVENTION

Known radiation-sensitive detector elements, in particular photoelectric elements, are used for converting electromagnetic radiation signals into electrical signals. A multitude of possible uses exist for such detector elements. Employment in the scanning unit of photoelectrical position measuring systems should be mentioned in this connection, for example. In this case the detector elements provided are used for detecting the amplitude-modified radiation signals resulting from the relative displacement of a scale graduation and a scanning plate. A design of the greatest possible compactness is required, i.e. as a result, certain demands are made on the radiation-sensitive detector elements used. Furthermore, the simplest possible production of the components used, in particular, of the detector elements, is desirable.

The customary radiation-sensitive detector elements have an active area, in which layers with different charge carrier concentrations are arranged adjacent to each other, for example semiconductor layers with different doping. For example, these are pn-junctions, in which free charge carriers are created in a space charge region being formed by the incident electromagnetic radiation. Commercially available photoelectric elements on a silicon base consist of n-doped silicon, into whose surface a thin layer of p-doped silicon was diffused. In this case the active area mentioned, in which a charge separation takes place upon the incidence of light, lies just below the radiation-sensitive surface. Contact elements or contact electrodes disposed on the detector element are necessary for transmitting the electrical signals generated in this way to an evaluation circuit.

Radiation-sensitive detector elements in the scanning unit designed in this way can now be integrated in a printed circuit board, for example, on which parts of the downstream evaluation electronics can also be additionally arranged. Thus the design of the detector elements as so-called SMD elements (surface mounted devices) offers itself. These are understood to be miniaturized components which can be mounted directly on the surface of printed circuit boards or other substrates. However, certain demands are made, in particular in connection with providing contacts, on such a design of the radiation-sensitive detector elements. It has been shown to be advantageous in this case if the detector elements are provided with suitable contacts on the side disposed opposite to the radiation-sensitive surface.

Such connections on the rear in connection with solar cells are basically known from U.S. Pat. No. 4,897,123 and EP 0 452 588. In U.S. Pat. No. 4,897,123 it is suggested in connection with this to lead one of the two contacts via a clamp-like connection from the radiation-sensitive surface in the direction toward the opposite surface, i.e. the rear. The second contact is already located on this opposite surface, so that the provision of contacts from the rear of the component is possible, The technical manufacturing outlay for forming the clamp-like connections between the front and rear of the component in particular has been shown to be disadvantageous.

It is known from EP 0 452 588, to allow the provision of contacts in the rear by means of appropriately sized openings through the active area, i.e. to provide the contacts on the side opposite from the radiation-sensitive side. In connection with the provision of contacts of this type, the crystalline structure of the various semiconductor layers is undesirably affected or interrupted because of the provided openings.

Photoelectric elements and IR detector elements with contact electrodes disposed on the rear are further known from publications by R. S. Sussmann et al., "Ultra-Low-Capacitance Flip-Chip-Bonded GaInAs PIN Photodetector for Long-Wavelength High-Data-Rate Fibre-Optic Systems" in Electronics Letters, July 1985, vol. 21, No. 14, pp. 593 to 595, and "SDI Needs Alter Detector's Mission", in Photonics Spectra, January 1986, pp. 86 , 88. However, details regarding the manufacture of such detector elements cannot be found in these publications.

OBJECT AND SUMMARY OF THE INVENTION

It is the object of the instant invention to create a radiation-sensitive detector element as well as a process for its manufacture, which can be mounted by using SMD technology and is simple and cost-effective to manufacture. In particular, a possibility for providing contacts on the side arranged opposite the side on which the incident radiation impinges is particularly demanded.

This object is attained by a radiation-sensitive detector element having the characteristics of claim 1.

Advantageous embodiments of the radiation-sensitive detector element ensue from the characteristics of the claims dependent from claim 1.

A process for producing a radiation-sensitive detector element is recited by means of the steps in claim 15.

Advantageous embodiments of the manufacturing process in accordance with the invention ensue from the steps in the claims dependent from claim 15.

Thus the embodiment in accordance with the invention of the radiation-sensitive detector element allows SMD mounting on a printed circuit board, since providing contacts to the detector element from the rear is possible, i.e. from the side which is disposed opposite the radiation-sensitive side. Thus, in case of employment of the detector element in the scanning unit of a photoelectric position measuring system, the demands mentioned in connection with the desired small space requirements can be met.

There are furthermore advantages in connection with mass production of such components, if they can be produced in the so-called batch process analogously with semiconductor production. In this case a large number of identical components are simultaneously produced on a single carrier substrate, for example made of silicon.

Further advantages as well as details of the attainment of the object in accordance with the invention ensue from the following description of several exemplary embodiments in connection with the attached drawings.

BRIEF DESCRIPTION OF THE DRAWINGS

FIG. 5b shows the design of the contacts in the form of embodiment of FIG. 5a;

FIGS. 7a to 7e show respective process steps for producing the detector element in FIG. 6.

DETAILED DESCRIPTION OF THE PREFERRED EMBODIMENTS

Figure 1:
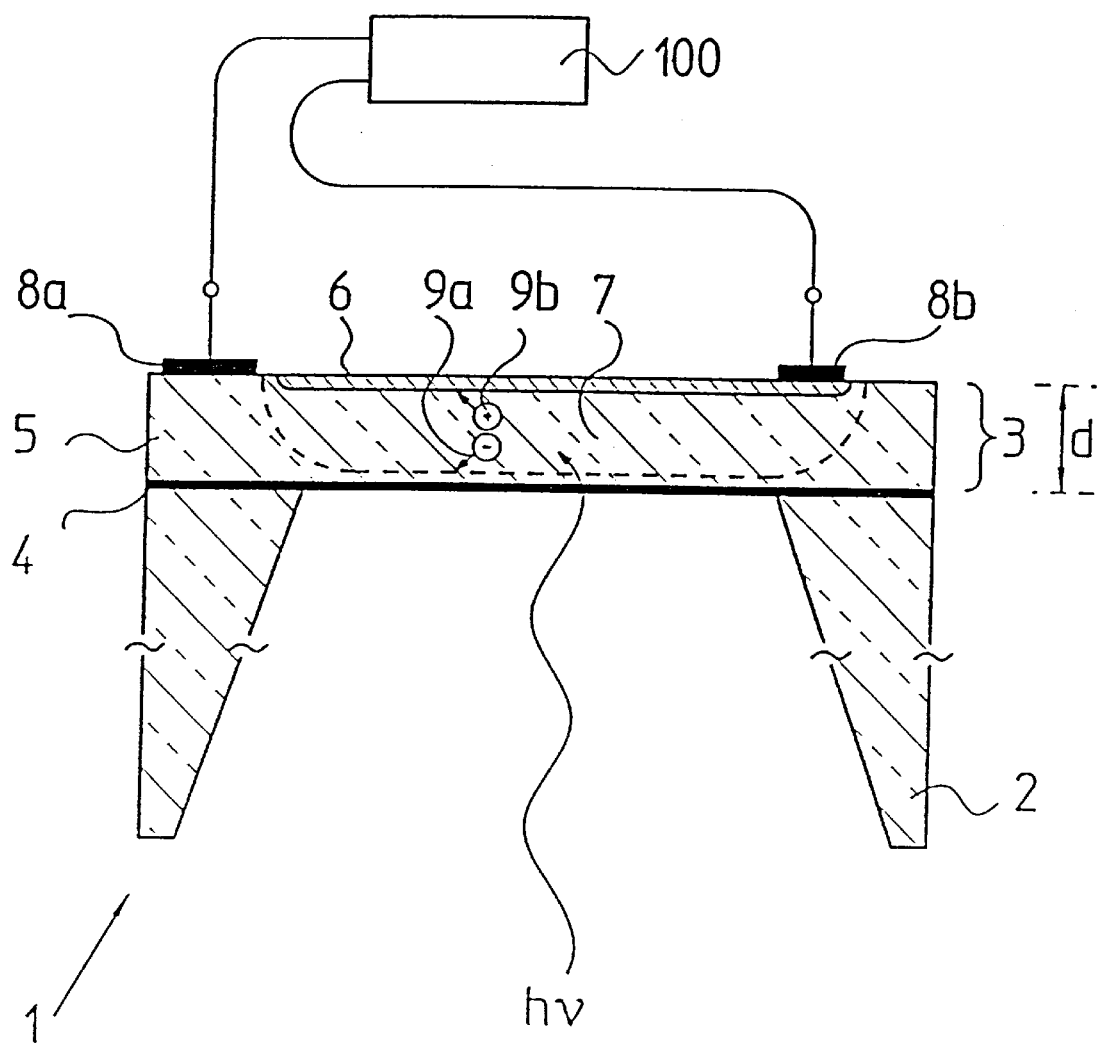
FIG. 1 represents a first exemplary embodiment of the radiation-sensitive detector element in accordance with the invention.
Figure 2:
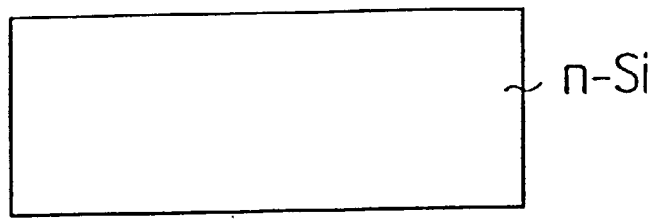
FIGS. 2a to 2d show respective process steps for producing the detector element in FIG. 1.
Figure 2:
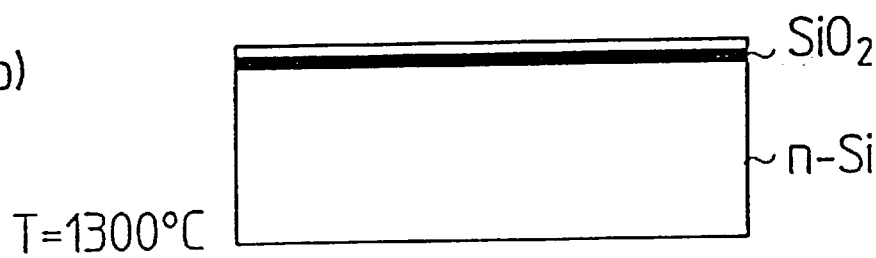
Figure 2:
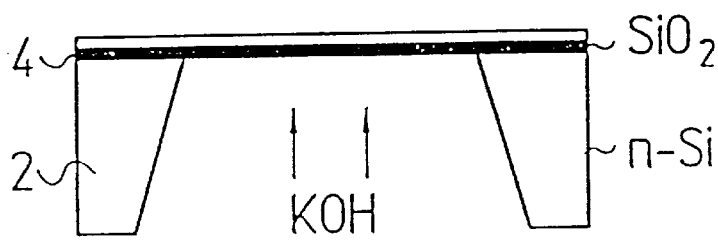
Figure 2:
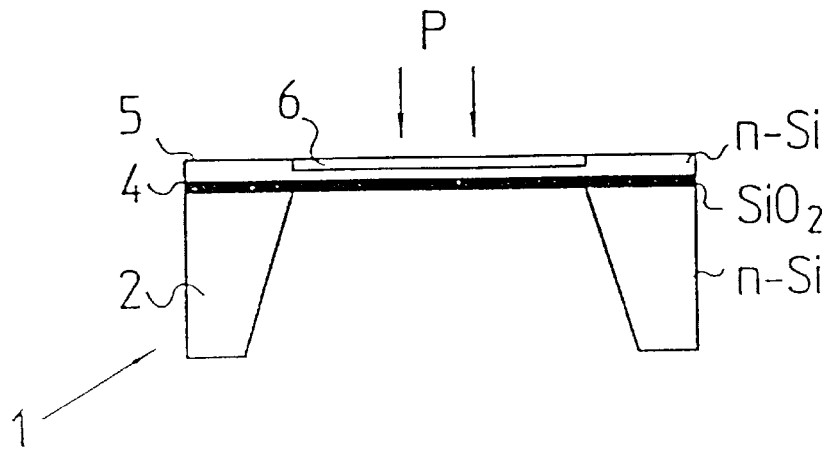

FIG. 1 shows a first embodiment of the radiation-sensitive detector element (1) in accordance with the invention in a lateral sectional view. It is comprised of a carrier structure (2) on which a layered arrangement (3) with several different layers (5, 6) has been applied, two different layers (5, 6) in the exemplary embodiment shown. The top of the detector element (1) is provided with two contact elements (8a, 8b). Gold is provided as the material for the contact elements (8a, 8b) of the represented variant.

Accordingly, in the representation of FIG. 1 the electro-magnetic radiation (hv) to be detected acts on the underside of the detector element (1), i.e. the underside functions as the actual radiation-sensitive surface. But the contact elements (8a, 8b) for connecting the detector element (1) with a schematically represented downstream evaluation circuit (100) are provided on the top, i.e. on the side disposed opposite the radiation-sensitive side. As explained above, this arrangement is particularly practical for the desired SMD mounting of the component on a printed circuit board and is made possible by means of the steps in accordance with the invention which will be described below.

The layer arrangement (3) on the carrier structure (2) is comprised of two adjoining layers (5, 6) or layer areas, in which different charge carriers of a respectively defined concentration are present. An n-doped silicon semiconductor layer is provided as the lower layer (5), on top of it is a p-doped silicon semiconductor layer (6). A barrier layer forms in the boundary area between the two layers (5, 6), which hereafter will be identified as the active area (7) and which is shown enlarged in the representation of FIG. 1. The generation of pairs of charge carriers (9a, 9b), which in turn can be detected as electrical signals in the downstream connected evaluation circuit (100), results in the active area (7) of the layer arrangement (3) upon incidence of the electromagnetic radiation (hv). For this purpose the two semiconductor layers (5, 6) are provided on the top with the already mentioned contact elements (8a, 8b).

A further layer (4), which is embodied as $SiO_2$ layer and whose function will be described in detail in the course of the description, is provided below the layer arrangement (3) with the two differently doped layers (5, 6). It should only be mentioned here that, because the angle of incidence of the radiation (hv) to be detected, this layer (4) must of course be transparent to the respective radiation wavelength (λ).

With known radiation-sensitive detector elements or photoelectric elements, the incident radiation (hv) as a rule impinges on the opposite side of the component, i.e. from the side of the layers which as a rule is the thinner of the two semiconductor layers (6), because of which providing contacts from the rear and therefore the desired SMD mounting is not possible.

In accordance with the invention it is therefore now provided to make the layer arrangement (3) of such a size, that the detector element (1) can be acted upon by the radiation (hv) to be detected from the actual "rear". Accordingly, the electro-magnetic radiation (hv) first impinges on the thicker (5) of the two semiconductor layers of the pn-junction before the generation of charge carriers (9a, 9b) takes place in the active area (7). To do this it is particularly necessary to first set the position of the active area (7) of the radiation-sensitive detector element (1) in relation to the radiation-sensitive surface in a defined manner. Preferably the doping concentrations in the two adjoining layers (5, 6) are varied for the defined setting of the spatial extent or position of the active area (7) in respect to the delimiting surfaces. The active area (7) is formed in a suitable manner depending on the selected concentration.

The penetration depth of the radiation (hv) to be detected therefore must be sufficient to make the separation of the charge carriers in the active area (7) possible, even though first the thicker (5) of the two semiconductor layers (5, 6) must be penetrated, i.e. the radiation incidence takes place from this direction. To this end the thickness d of the layer arrangement (3) in the exemplary embodiment represented in FIG. 1 was selected to be so thin that the mentioned prerequisites are met, i.e. the charge carrier separation takes place in the active area (7). Accordingly, in this embodiment the active area (7) takes up almost the entire thickness of the layer arrangement (3).

Since the layer (4) provided underneath the layer arrangement (3) is transparent to the incident radiation (hv), its thickness is of subordinate importance in this connection.

Based on these considerations, at a wavelength of 830 nm to be detected and with the selected materials, the result is a layer thickness d of the two semiconductor layers (5, 6) on the order of 2 to 5 m. Accordingly, the active area (7) in this embodiment in accordance with the representation in FIG. 1 is formed in almost the entire layer arrangement (3).

Analogously to this, the parameters to be selected change with other radiation wavelengths or other materials. Accordingly, in this way it is also possible to utilize thicker layer arrangements, in which the active area does not comprise the entire layer thickness, but can be adjusted appropriately in relation to the radiation-sensitive surface as a function of the radiation wavelength. It is again important that the penetration depth of the radiation to be detected is sufficient in every case to reach the active area or the boundary layer or space charging zone forming in the adjoining layers through the thicker layer.

To determine the actual position of the active area or the thicknesses of the layer arrangements, the wavelength-dependent absorption characteristics of these materials must also be employed in other cases. In this connection reference should be made, for example, to the appropriate graphic representation of these correlations for various suitable materials in S.M. Sze "Physics of Semiconductor Devices", 2nd ed., New York 1981, p. 750, FIG. 5.

These considerations do of course also apply to other types of junctions in radiation-sensitive detector elements, not only for purely semiconductor-to-semiconductor junctions, but for example also for Schottky contacts with metal-semiconductor junctions. It is of course also possible to select other semiconductor materials, such as GaAs, InP, etc.

In order to adjust the thickness d of the layer arrangement (3) or the thickness of the two semiconductor layers (5, 6) to be appropriately slight, certain technical production steps have been shown to be advantageous in connection with the exemplary embodiment represented in FIG. 1. For example, it is provided that the two semiconductor layers (5, 6) or the active area (7) are separated by a barrier layer (4) from the carrier structure (2). As already indicated, the barrier layer is embodied as an $SiO_2$ layer, which is transparent to the wavelength of 830 nm to be detected.

In the production of the detector element (1) in accordance with the invention, which will be explained below by means of FIGS. 2a to 2d, this barrier layer (4) acts as an etch stop layer. The creation of this layer takes place in accordance with the so-called SIMOX method (Separation by Implanted Oxygen). Regarding further details of this method, reference is made to the publication by A. Müller et al. with the title "Ein thermoe-lektrischer Infrarotsensor als Beispiel für den Einsatz von SIMOX-Substraten für die Herstellung von Sensoren und Mikrosystemen" [A Thermoelectric Infrared Sensor as an Example for the Employment of SIMOX Substrates for Producing Sensors and Microsystems] in SENSOR 93, Proceedings Vol. III, pp. 238 to 245.

A first process step of the manufacturing process is represented in FIG. 2a, wherein an oxygen implantation into an n-doped monocrystalline Si substrate takes place. In the second process step in FIG. 2b, the oxygen which was introduced slightly below the surface is tempered in a process of several hours at high temperatures of approximately 1300° C. In the course of this, radiation damage is healed and the implanted oxygen is combined with the silicon to form an $SiO_2$ layer, which has sharp junctions with the adjoining Si substrate. Typical thicknesses of the $SiO_2$ layer are on the order of several hundred nm (nanometers). The distance of the introduced layer from the surface above it is also some hundreds of nm.

In the following process step of FIG. 2c, the $SiO_2$ layer is now used as a barrier layer during the etching process, during which the lower part of the Si layer is selectively etched away down to the $SiO_2$ barrier layer or etch stop layer by means of a caustic potash solution (KOH), so that the carrier structure (2), which can also be seen in FIG. 1, results, which mechanically stabilizes the complete detector element (1). In case the detector element (1) is made round, the carrier structure (2) is accordingly designed to be round; of course, other geometric shapes can also be realized. The central area of the detector element (1), which was exposed by etching with the delimiting $SiO_2$ layer, subsequently acts as the radiation-sensitive surface. In addition, a filler material (not represented), which is transparent to the radiation to be detected and provides an additional mechanical stabilization of the detector element (1), can be introduced into the area of the recess underneath it.

Finally, in process step 2d a spatially limited p-doped zone (6) of little thickness is introduced by means of known diffusion techniques into the thin silicon layer located above the barrier layer, so that the structure of the layer arrangement already described by means of FIG. 1 results. Typical thicknesses of this layer are approximately in the range of several hundreds of nm.

The final provision of the top with contacts by means of the contact electrodes is not represented and takes place by means of known bonding methods in the form of sputtering or vapor deposition.

Beside the use of an $SiO_2$ layer in the detector element in accordance with the invention as the barrier layer or etch stop layer, it is also possible to perform a boron implantation alternatively to the oxygen implantation, so that a corresponding barrier layer in the form of a silicon-boron compound is formed slightly below the surface. With a suitably selected boron concentration, for example, in a concentration range of $10^{20}$ atoms/cm$^3$, this layer then also acts as an etch stop layer, and the production of the detector element in accordance with the invention is possible analogously with the process steps in FIGS. 2a to 2d.

A possibility of optimizing the detector element in accordance with the invention in respect to the wavelength used furthermore lies in that, following the finished oxygen or boron implantation and the subsequent tempering process, a silicon layer of a defined thickness is epitaxially grown on the etch stop layer in a separate process step. In this way the thickness of the layer arrangement and thus also the position of the active area in relation to the radiation-sensitive surface can be adjusted in the desired manner. This is particularly advantageous for matching the thickness of the layer arrangement to the penetration depth of the electromagnetic radiation used, because a simple possibility for providing a size optimized in respect to the wavelength is the result. The active area within the layer arrangement thus is always located at a distance from the radiation-sensitive surface which is matched to the wavelength-dependent penetration depth. The required p- and n-doping of the two layers is performed in accordance with the epitaxy process by means of appropriate diffusion processes, wherein the different charge carriers are introduced in a defined manner into spatially separated areas of the layer arrangement.

Further than that, an optimization of the detector element in accordance with the invention with respect to radiation which lies in the infrared spectrum range can also be achieved if germanium atoms are introduced in a defined concentration into the epitaxially grown silicon layer, so that an Si-Ge overlay grid results. It is thus possible in this spectrum area to advantageously affect the detector element sensitivity by means of a corresponding concentration of the introduced germanium.

A second embodiment of the radiation-sensitive detector element (31) in accordance with the invention will be described below by means of FIG. 3. Analogously with the first exemplary embodiment, the thickness d of the layer arrangement (33) with the two differently doped semiconductor layers (35, 36) and the active area (37) is of such a size that the radiation-sensitive face of the detector element (31) is located opposite the face on which the contact elements (38a, 38b) in the form of contact electrodes are disposed. However, alternatively to the embodiment in FIG. 1, the layer arrangement (33) with the active area (37) is now embodied as an appropriately thin diaphragm. The required doping of the diaphragm (33), i.e., the formation of p- and n-doped layers or areas, is already contained in the diaphragm (33) which was produced in accordance with the requirements.

In connection with such semiconductor diaphragms, reference is made to an information publication of Virginia Semiconductor, Inc. from May 1992, in which such diaphragms, which are embodied as silicon diaphragms, have been described.

In connection with such an embodiment of the layer arrangement, the option of a large-surface and therefore efficient production of the semiconductor diaphragms, and therefore also of the detector elements, is advantageous. The use of other materials for the semiconductor diaphragms is basically also possible.

Figure 3:
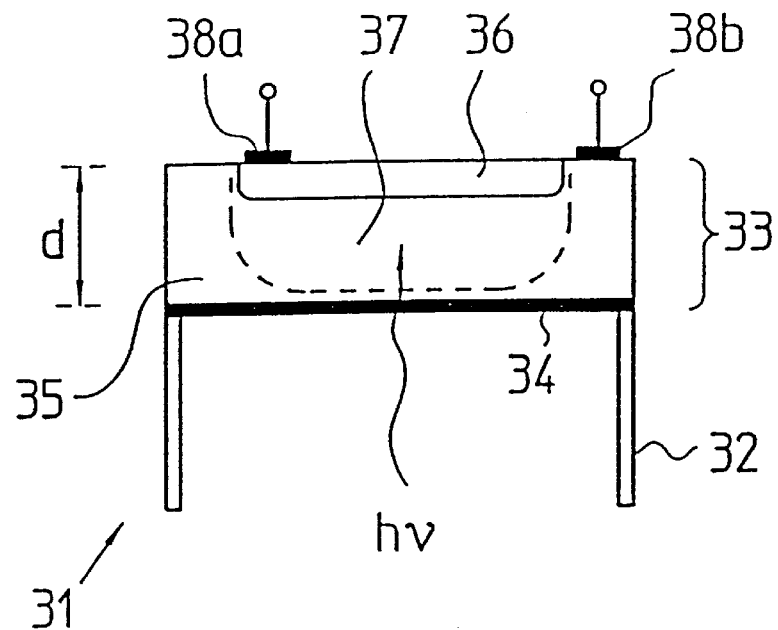
FIG. 3 represents a second form of embodiment of the radiation-sensitive detector element in accordance with the invention.

On the side of the detector element (31) facing the incident radiation (hv), a further transparent passivation layer (34) is disposed in the exemplary embodiment represented in FIG. 3. This passivation layer (34) is used to stabilize the electrical properties of the diaphragm (33) or the component, i.e., as a protection against diverse environmental effects. $SiO_2$ or $Si_3N_4$ are suitable as passivation layers (34), which can be respectively deposited on the appropriate surface from the gaseous phase.

In this embodiment of the detector element in accordance with the invention it is provided for further mechanical stabilization to arrange the diaphragm (33) including the passivation layer (34) on a carrier element (32), for example, a cylinder-shaped one. In this connection it has been additionally shown to be advantageous if the carrier element (32) used has the same heat expansion coefficient as the diaphragm (33) in order to prevent possibly occurring mechanical stresses when they are being heated. In connection with a silicon diaphragm (33), a carrier element (32) made of silicon would therefore be suitable in respect to the same heat expansion coefficient; the use of Pyrex would also be possible as an alternative to this.

Furthermore, the most solid mechanical connection possible between the diaphragm (33) and the carrier element (32) is advantageous in order to assure the stability of the detector element (31) against shocks and the like. A combining technology which is particularly suited for this is the so-called "anodic bonding", in which bonding with crystalline junction structures is possible by means of defined temperatures and/or electrical fields. Suitable carrier materials on a silicon base for bonding silicon diaphragms are offered by the HOYA company, for example. In this connection reference is made to the company brochure "SD-2 Glass for Anodic Bonding", in which a carrier material which is suitable for this is described.

In connection with the exemplary embodiments so far described there is the further option of installing further electronic components in the layer arrangement with the active area, for example, amplifier elements or temperature sensor elements.

Figure 4:
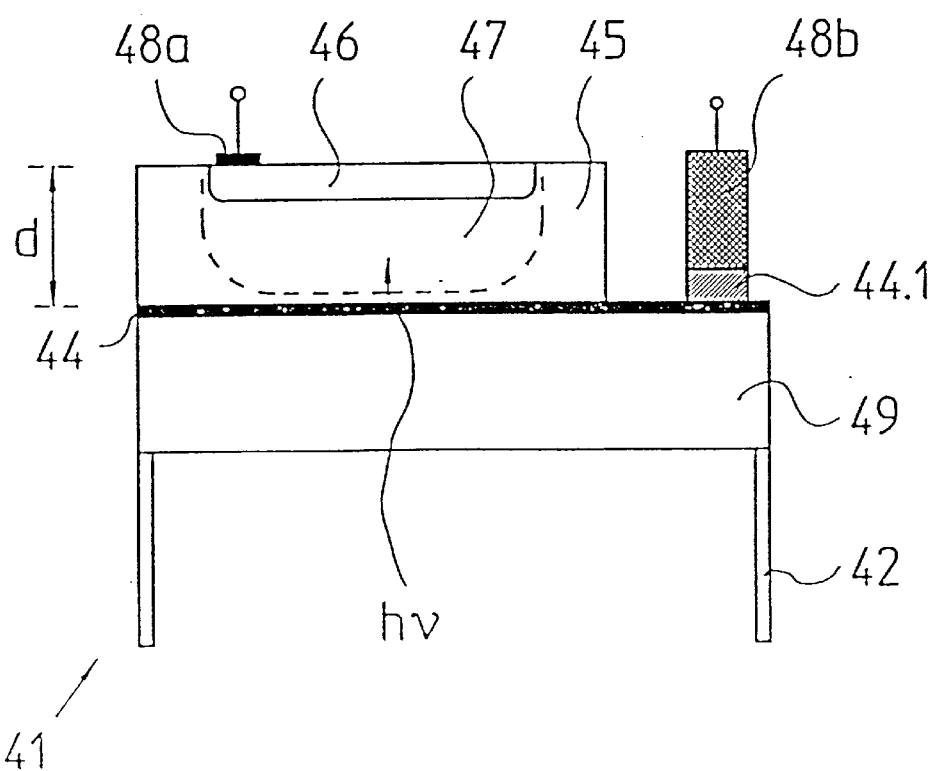
FIG. 4 represents a third form of embodiment of the radiation-sensitive detector element in accordance with the invention.

A third possible embodiment of the radiation-sensitive detector element (41) in accordance with the invention is represented in FIG. 4. It has again been provided in accordance with the invention to make the dimensions of the layer arrangement (43) with the two differently doped semiconductor areas (45, 46) and the active are (47) of such a size, that providing contacts on the surface opposite the incident light surface is possible.

In this case a layer arrangement (43) of a thickness d has been applied to a carrier substrate (49), for example glass, which is transparent to the radiation (hv) to be detected. In contrast to the monocrystalline or amorphous silicon mentioned in FIG. 1, so-called nano- or micro-crystalline silicon now is provided, which is differently doped in the two layers (45, 46) or layer areas. Such material shows high spectral sensitivity in the infrared wavelength range, in addition, it is sufficiently stable over a long time. Because of the defined adjustability of the internal crystalline structure it is additionally possible to vary the desired spectral sensitivity in a defined manner during the production process. The application of the nano- or micro-crystalline silicon on the carrier substrate (49) takes place by deposition in the gas phase.

Regarding further details of this material, reference is made to the conference article "Initial Stages of Microcrystalline Silicon Film Growth" by S. Koynov et al. during the Int. Conf. on Amorph. Semicond. (Kobe, Japan, Sept. '95).

In the exemplary embodiment represented in FIG. 4, the carrier substrate (49) is furthermore disposed on a cylinder-shaped carrier element (42) for further mechanical stabilization.

One of the two contact elements (48a) is connected at the rear of the detector element with one of the two differently doped layer areas (46) by means of a suitable connecting technique. A conductive intermediate layer arrangement (44) is provided between the layer arrangement (43) and the carrier substrate (49) for providing the other layer area (45) with contacts. In this case the intermediate layer arrangement (44) consists of an indium-tin-oxide layer which is transparent to the radiation (hv) to be detected. Typical thicknesses of this intermediate layer arrangement (44) lie between 30 and 200 nm.

Here, the intermediate layer arrangement (44) extends over a surface which is larger in size than the adjoining surface of the layer arrangement (43) with the active area (47), in the represented exemplary embodiment therefore over the complete surface of the carrier substrate (49). In the contact area of the intermediate layer arrangement (44) which projects past the layer arrangement (43) with the active area (47), the indium-tin-oxide layer (44) has been furthermore provided with an adhesive layer (44.1) of titanium placed on top of it. The second contact element (48b) in the form of a contact electrode which, for example had been vapor-deposited from gold, titanium or nickel, is disposed on the adhesive layer (44.1).

Thus, providing the detector element (41) with contacts on the surface which is oriented opposite the radiation-sensitive surface is possible in this way.

Figure 5A:
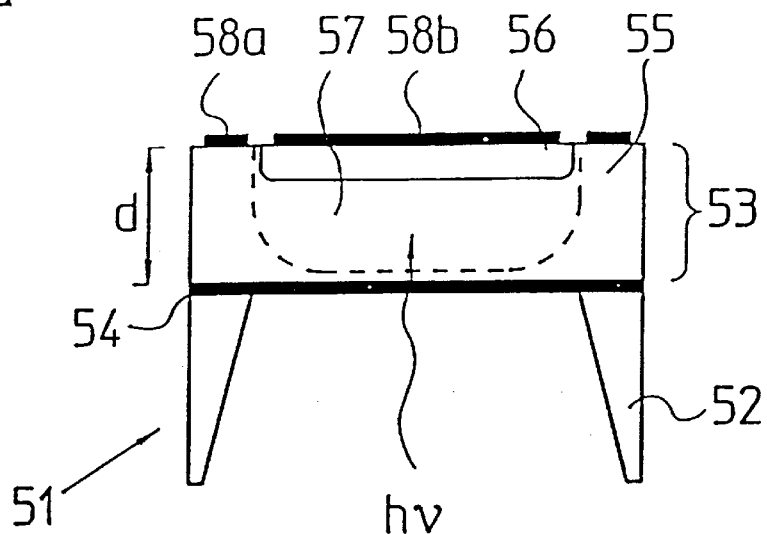
FIG. 5a represents a fourth form of embodiment of the radiation-sensitive detector element in accordance with the invention.
Figure 5B:
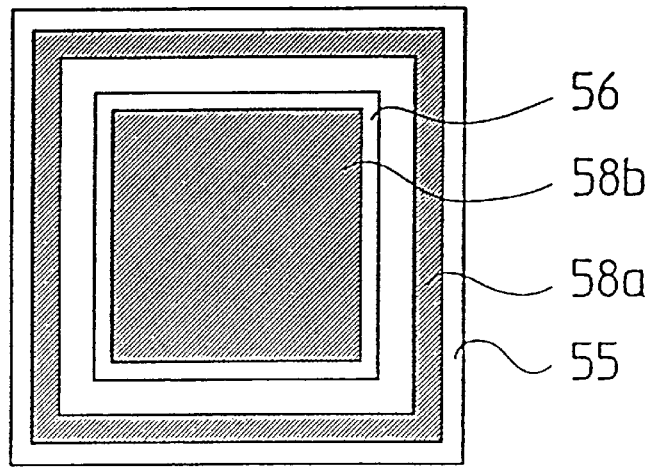

A further embodiment of the radiation-sensitive detector element in accordance with the invention is shown in FIGS. 5a and 5b. The variant represented there differs from the one in FIG. 3 only in the type of contacting selected and the shape of the detector element (51). It is now provided to embody the two contact elements (58a, 58b) each over extensive surfaces on a detector element (51) which now has a square cross section. To this end, a square-shaped first contact electrode (58b) disposed on the surface opposite the radiation-incidence side is connected with one of the two layer areas (55, 56) of different doping. The second contact electrode (58a) is disposed in a ring shape around the first contact electrode (58b) and is connected with the second layer area (55). Possibly existing locally different sensitivities of the detector element (51) can be prevented by means of such contact over an extensive area. Alternative geometric shapes of the contact electrodes embodied over extensive areas are of course also possible, for example contact electrodes disposed in a dynamically balanced manner, etc.

Figure 6:
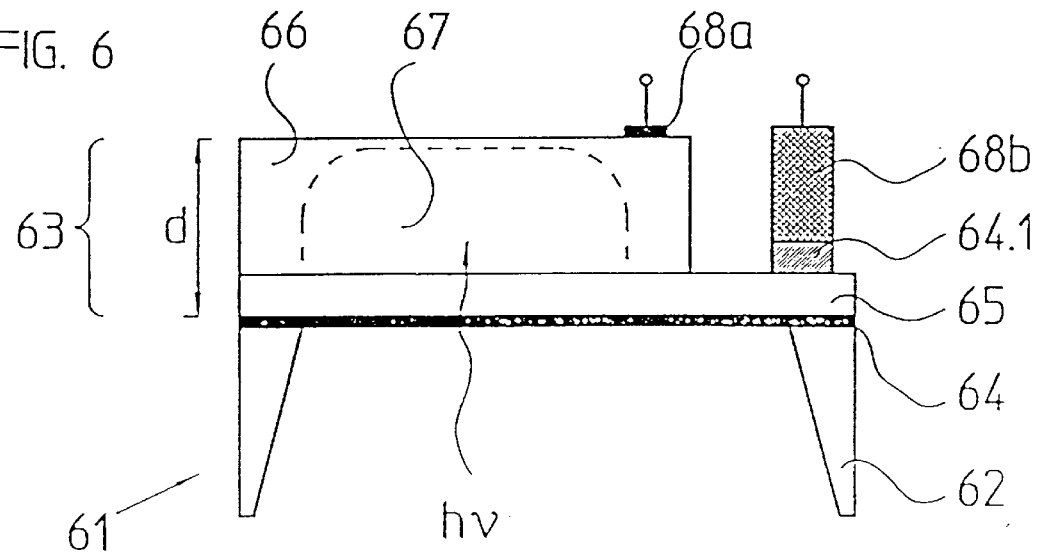
FIG. 6 represents a fifth form of embodiment of the radiation-sensitive detector element in accordance with the invention.

A further exemplary embodiment of the radiation-sensitive detector element in accordance with the invention is represented in FIG. 6. Here, a barrier layer (64) is disposed on a carrier element (62), on top of which the layer arrangement (63) with two differently doped layer areas (65, 66) and the active area (67) forming in the boundary zone are located. In this case two differently doped layer areas (65, 66) are provided, the lower one of which disposed directly adjoining the $SiO_2$ etch stop layer has a larger base area as the differently doped layer (66) located above it, so that a contact area is available which can be reached from the rear once the material located on top has been removed. The layer area (65) which, in the represented exemplary embodiment has been embodied as a p-doped layer, then can be easily contacted, for which, analogously to the example in FIG. 4, an adhesive layer (64.1) is additionally arranged between the conductive layer area (65) and the contact electrode (68b). The second required contact element (68a) is conductively connected with the other layer area (66). Based on the selection of the thickness d of the layer arrangement (63), it is again assured that contacting of the detector element (61) on the rear surface is possible.

A suitable manufacturing process for the detector element (61) represented in FIG. 6 will be explained below by means of FIGS. 7a to e.

Based on an n-doped monocrystalline silicon substrate, first an $SiO_2$ layer (64) is introduced by means of the above explained SIMOX method. Following this, a p-doped layer area (65) is generated by means of an ion implantation process at a defined depth underneath the substrate surface located above the $SiO_2$ layer. In the next process step, the $SiO_2$ layer (64) again takes on the function of an etch stop layer, as previously explained, i.e. within the framework of an etching process the radiation-sensitive surface area of the detector element (61) is exposed by etching with a caustic potash solution (KOH). As in the exemplary embodiment in FIG. 2, a carrier structure remains in the edge areas which increases the mechanical stability of the component. Afterwards an edge area of the n-doped silicon is removed as far as the p-doped layer by means of a subsequent lithography and etching process.

Thus, in this embodiment the p-doped and therefore conductive layer (64) is used as a whole-surface contact surface, on which a suitable contact element (68b) can be arranged.

Obviously the various mentioned materials for the layer arrangement of a size in accordance with the invention in the explained exemplary embodiments can be combined with the various types of contacting. The same applies to the other, above explained steps in the individual exemplary embodiments. In this way a number of other embodiments of the detector element in accordance with the invention result, which were not explicitly mentioned in the above description, but nevertheless are based on knowledge in accordance with the invention.

What is claimed is:

1. A radiation-sensitive detector element (1, 31, 41, 51, 61) with an active area (7, 27, 37, 47, 57, 67) formed between two adjoining layer areas (5, 6; 25, 26; 35, 36; 45, 46; 55, 56; 65, 66) of a layer arrangement (3, 33, 43, 53, 63) of different charge carriers, in which a conversion of incident electromagnetic radiation (hv) into electrical signals takes place, wherein, taking into consideration the penetration depth of the radiation (hv), the position of the active area (7, 27, 37, 47, 57, 67) in relation to the two delimiting surfaces is selected in such a way that at least two contact elements (8a, 8b; 38a, 38b; 48a, 48b; 58a, 58b; 68a, 68b) for connecting the detector element (1, 31, 41, 51, 61) to an evaluation circuit (100) can be mounted on a surface located opposite the radiation-sensitive surface on which the incident radiation (hv) impinges.

2. A radiation-sensitive detector element (1, 31, 41, 51, 61) in accordance with claim 1, wherein the thickness (d) of the layer arrangement (3, 33, 43, 53, 63) is of such size, that the penetrating radiation (hv) reaches the active area (7, 27, 37, 47, 57, 67) in every case.

3. A radiation-sensitive detector element (1, 31, 41, 51, 61) in accordance with claim 1, wherein in the direction of the incident radiation (hv), the layer arrangement (3, 33, 43, 53, 63) is provided with an etch stop layer (4, 44, 54, 64) which is transparent to the incident radiation (hv).

4. A radiation-sensitive detector element (1, 31, 41, 51, 61) in accordance with claim 3, wherein the etch stop layer (4, 44, 54, 64) is embodied as an $SiO_2$ layer.

5. A radiation-sensitive detector element (1, 31, 41, 51, 61) in accordance with claim 1, wherein the layer arrangement (3, 33, 43, 53, 63) is embodied as an epitaxially-grown silicon layer, having at least two layer areas (5, 6; 25, 26; 35, 36; 45, 46; 55, 56; 65, 66) with different doping.

6. A radiation-sensitive detector element (1, 31, 41, 51, 61) in accordance with claim 5, wherein germanium ions are introduced in defined concentrations into the epitaxially grown silicon layer.

7. A radiation-sensitive detector element (31) in accordance with claim 5, wherein the layer arrangement (33) is embodied as a thin semiconductor diaphragm of defined thickness (d) and has layer areas (35, 36) of different doping.

8. A radiation-sensitive detector element (1, 31, 41, 51, 61) in accordance with claim 1, wherein the surface facing the incident radiation (hv) is provided with a radiation-permeable passivation layer (34) for stabilizing the electrical properties.

9. A radiation-sensitive detector element (1, 31, 41, 51, 61) in accordance with claim 8, wherein the passivation layer (34) is embodied as an $SiO_2$ or $Si_3N_4$ layer.

10. A radiation-sensitive detector element (31) in accordance with claim 7, wherein the semiconductor diaphragm (33) is disposed on a carrier substrate (32) which has the same thermal expansion coefficient as the semiconductor diaphragm.

11. A radiation-sensitive detector element (41) in accordance with claim 1, wherein the layer arrangement (43) disposed on the carrier substrate (42) comprises at least one layer of nano- or micro-crystalline silicon.

12. A radiation-sensitive detector element (51, 61) in accordance with claim 1, wherein at least one of the contact elements (58a, 58b; 68a, 68b) is embodied as a contacting area.

13. A radiation-sensitive detector element (51, 61) in accordance with claim 12, wherein one of the two layers areas (55, 56; 65, 66) of the layer arrangements (53, 63) has a larger base area than the respectively other layer area (55, 56; 65, 66), and the larger layer area (55, 56; 65, 66) is provided with a contact area (58a, 58b; 68a, 68b), which is connected via a further contact element (58a, 58b; 68a, 68b) with the downstream-connected evaluation circuit 100.

14. A radiation-sensitive detector element (1, 31, 41, 51, 61) in accordance with claim 1 further comprising scanning unit of a photoelectric position measuring system.

15. A process for producing a radiation-sensitive detector element (1, 41, 51, 61) by means of the following process steps:

a) generation of an etch stop layer (4, 44, 54, 64) in a defined doped semiconductor substrate slightly underneath the delimiting first surface, b) spatially selective removal by etching of the substrate material present underneath the etch stop layer (4, 44, 54, 64) until the etch stop layer (4, 44, 54, 64) forms a delimiting second surface, c) generation of a spatially limited layer area (6, 46, 56, 66), with different doping than the semiconductor substrate, on top of the etch stop layer (4, 44, 54, 64), d) providing contacts for the detector element (1, 31, 41, 51, 61) on a site opposite to the second surface by means of at least two contact elements (8a, 8b; 38a, 38b; 48a, 48b; 58a, 58b; 68a, 68b).

16. The process in accordance with claim 15, wherein the creation of the etch stop layer (4, 44, 54, 64) includes the following partial process steps:
   a1) implantation of oxygen in a semiconductor substrate doped in a defined manner,
   a2) tempering the semiconductor substrate for forming a semiconductor-oxygen combination as the etch stop layer (4, 44, 54, 64) with sharply defined boundaries slightly below the surface of the semiconductor substrate.

17. The process in accordance with claim 15, wherein the spatially limited layer area (65) of different doping than the semiconductor substrate is introduced into the semiconductor substrate as the layer directly adjoining the etch stop layer (64).

18. The process in accordance with claim 17, wherein for providing contacts
   d1) a portion of the semiconductor substrate is removed up to the layer area (65) of different doping in one contact area,
   d2) an adhesive layer (64.1) is applied in the contact area,
   d3) a contact element (68b) is applied to the adhesive layer (64.1).

19. The process in accordance with claim 15, wherein further substrate material of a defined thickness is epitaxially grown on the substrate material above the etch stop layer.

20. A radiation-sensitive detector element in accordance with claim 7, wherein the surface facing the incident radiation (hv) is provided with a radiation-permeable passivation layer for stabilizing the electrical properties.

21. A radiation-sensitive detector element (1, 31, 41, 51, 61) with an active area (7, 27, 37, 47, 57, 67) formed between two adjoining layer areas (5, 6; 25, 26; 35, 36; 45, 46; 55, 56; 65, 66) of a layer arrangement (3, 33, 43, 53, 63) of different charge carriers, in which a conversion of incident electromagnetic radiation (hv) into electrical signals takes place, wherein, taking into consideration the penetration depth of the radiation (hv), the position of the active area (7, 27, 37, 47, 57, 67) in relation to the two delimiting surfaces is selected in such a way that at least two contact elements (8a, 8b; 38a, 38b; 48a, 48b; 58a, 58b; 68a, 68b) for connecting the detector element (1, 31, 41, 51, 61) to an evaluation circuit (100) can be mounted on a surface located opposite the radiation-sensitive surface on which the incident radiation (hv) impinges wherein a filler material that is transparent to the radiation to be detected and which provides mechanical stabilization is arranged underneath the radiation-sensitive surface.

* * * * *